(12) United States Patent
Ujiie et al.

(10) Patent No.: US 10,532,401 B2
(45) Date of Patent: Jan. 14, 2020

(54) LIQUID-COOLING COLD PLATE AND METHOD FOR MANUFACTURING SAME

(71) Applicant: HITACHI KOKUSAI ELECTRIC INC., Tokyo (JP)

(72) Inventors: Satoru Ujiie, Tokyo (JP); Takahiro Daikoku, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 163 days.

(21) Appl. No.: 15/556,307

(22) PCT Filed: Feb. 22, 2016

(86) PCT No.: PCT/JP2016/055076
§ 371 (c)(1),
(2) Date: Sep. 7, 2017

(87) PCT Pub. No.: WO2016/167022
PCT Pub. Date: Oct. 20, 2016

(65) Prior Publication Data
US 2018/0078997 A1    Mar. 22, 2018

(30) Foreign Application Priority Data

Apr. 13, 2015    (JP) ................... 2015-081660

(51) Int. Cl.
*B22D 19/00*     (2006.01)
*F28F 9/013*     (2006.01)
*H05K 7/20*      (2006.01)

(52) U.S. Cl.
CPC ........ *B22D 19/0072* (2013.01); *F28F 9/0131* (2013.01); *H05K 7/20254* (2013.01); *F28F 2240/00* (2013.01)

(58) Field of Classification Search
CPC ............ B22D 19/00725; F28D 1/0383; F28D 1/0475; F28D 1/04763; F28D 2021/0029;
(Continued)

(56) References Cited

U.S. PATENT DOCUMENTS 2,663,551 A * 12/1953 Boling ................. F25D 31/002
164/108
4,720,981 A * 1/1988 Helt ....................... F25B 40/00
165/80.4
(Continued)

FOREIGN PATENT DOCUMENTS

JP    H04-123854 A    4/1992
JP    H04-172168 A    6/1992
(Continued)

OTHER PUBLICATIONS

International Search Report with English language translation dated Mar. 22, 2016.

*Primary Examiner* — Justin M Jonaitis
(74) *Attorney, Agent, or Firm* — Bacon & Thomas, PLLC

(57) ABSTRACT

In a method of manufacturing a liquid-cooling cold plate, cast molding is performed after embedding a metal pipe for supplying a cooling liquid inside a casting mold. Fixing brackets to be attached to the metal pipe is provided to maintain a positional relationship between a plurality of portions of the metal pipe embedded in the casting mold. The casting molding is performed by pouring molten metal into the casting mold while the fixing metal parts are attached to the metal pipe.

2 Claims, 11 Drawing Sheets

(58) Field of Classification Search
CPC .... F28D 9/0081; F28D 1/0308; F28D 1/0366; F28D 9/0031; F28D 9/0062; F28F 1/006; F28F 1/16; F28F 3/12; F28F 9/0131; F28F 13/08; F28F 9/0258; F28F 2240/00; F28F 2255/146; F28F 3/14; F28F 1/126; F28F 1/128; F28F 1/22; F28F 1/32; H01L 23/473; H05K 7/20254
USPC ............ 165/80.4, 168, 170, 171; 29/890.03, 29/890.032, 890.04, 890.043, 890.045
See application file for complete search history.

(56) References Cited

U.S. PATENT DOCUMENTS

| | | | | |
|---|---|---|---|---|
| 5,154,792 A | * | 10/1992 | Patterson | C08G 18/0885 156/293 |
| 5,484,015 A | * | 1/1996 | Kyees | F25D 25/028 165/168 |
| 5,697,428 A | * | 12/1997 | Akachi | F28D 15/0233 165/104.14 |
| 5,829,516 A | * | 11/1998 | Lavochkin | F28F 1/22 165/80.4 |
| 6,031,751 A | * | 2/2000 | Janko | F28F 13/00 165/104.33 |
| 2016/0262284 A1 | * | 9/2016 | Ii | F28D 1/0477 |

FOREIGN PATENT DOCUMENTS

| | | |
|---|---|---|
| JP | H06-304739 A | 11/1994 |
| JP | 2000-340728 A | 12/2000 |
| JP | 2011-125893 A | 6/2011 |
| JP | 2011125893 A * | 6/2011 |

* cited by examiner

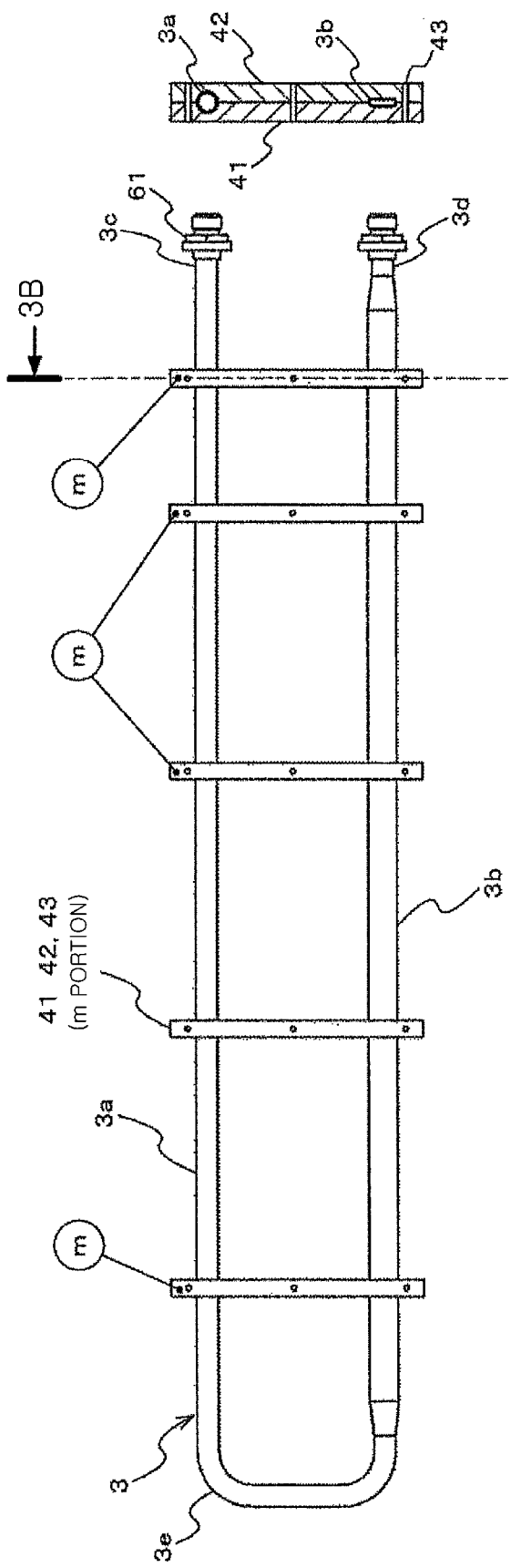
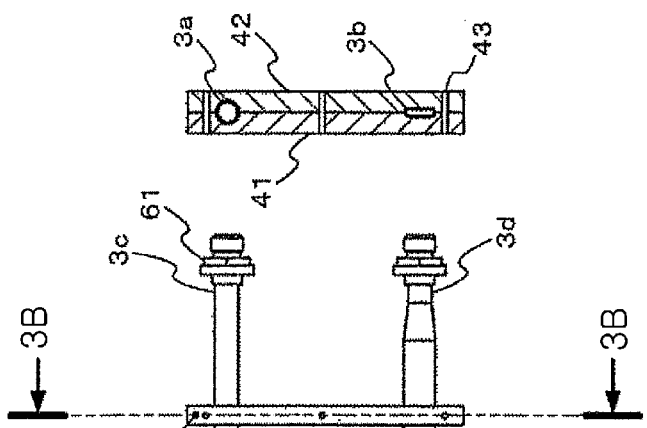
FIG.3A
FIG.3B

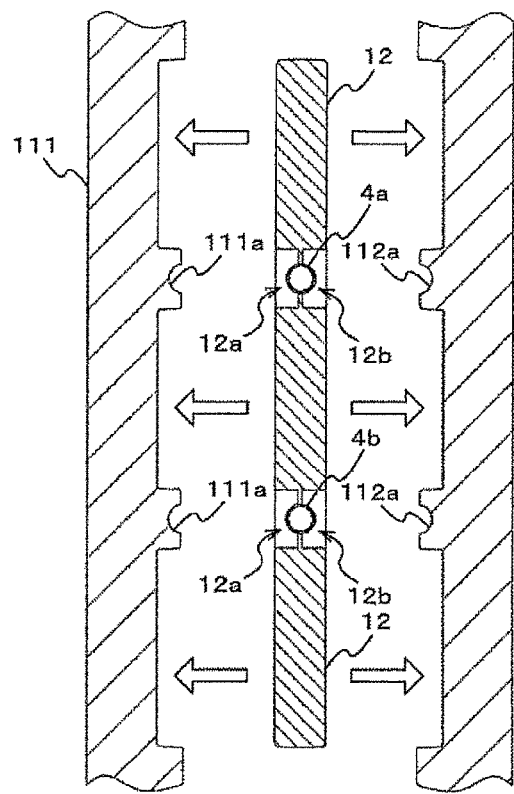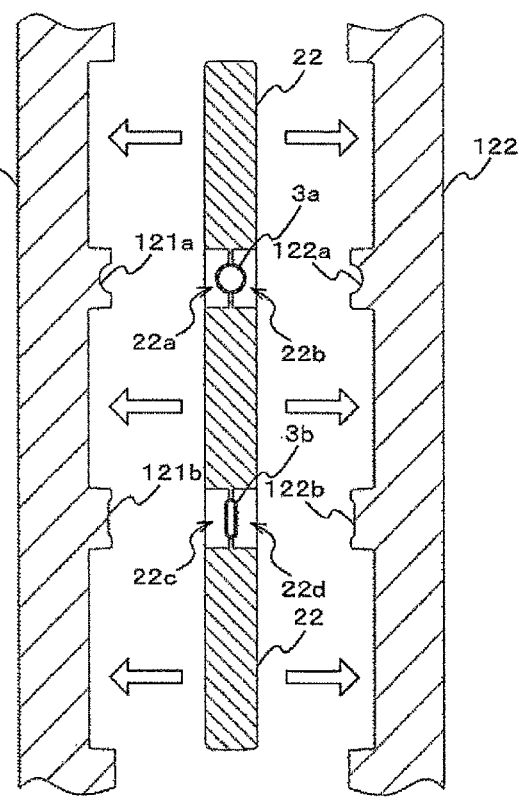
FIG.6
FIG.7

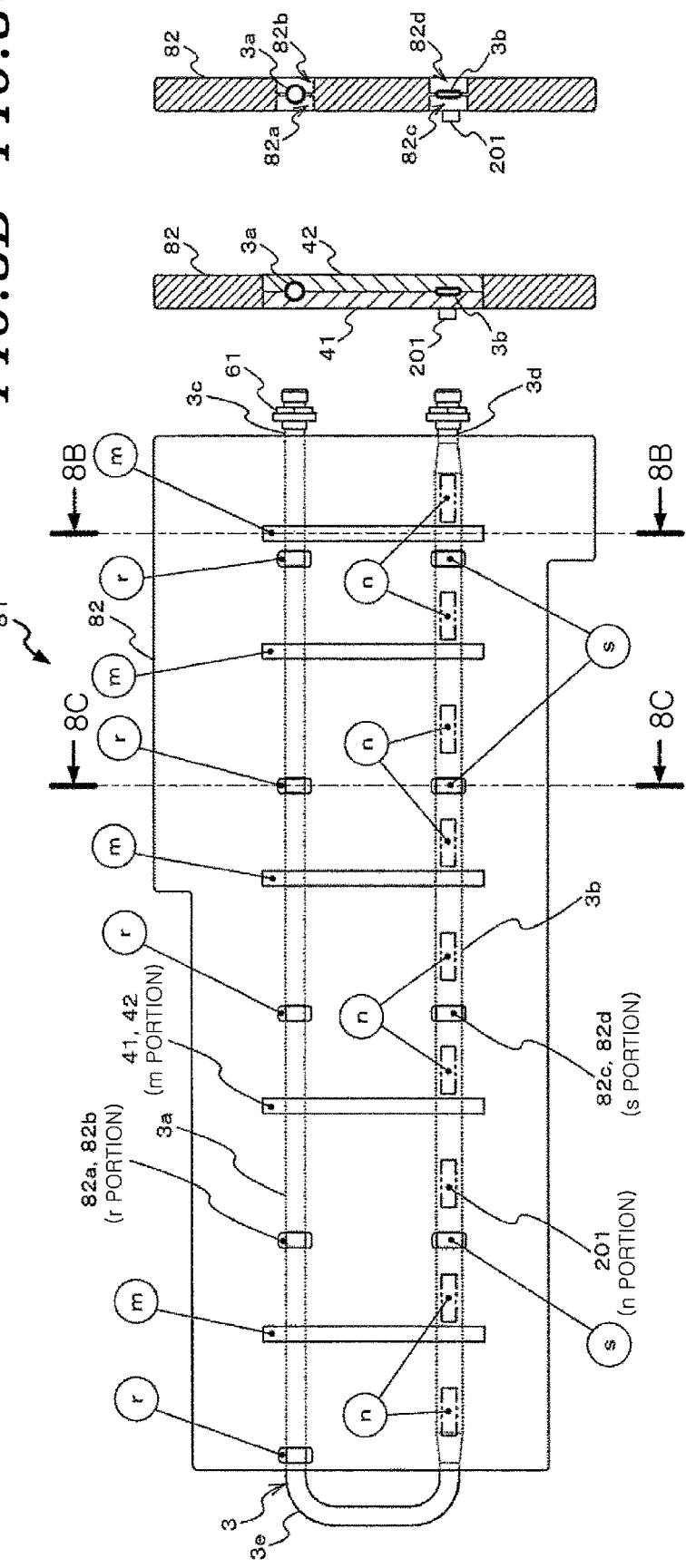

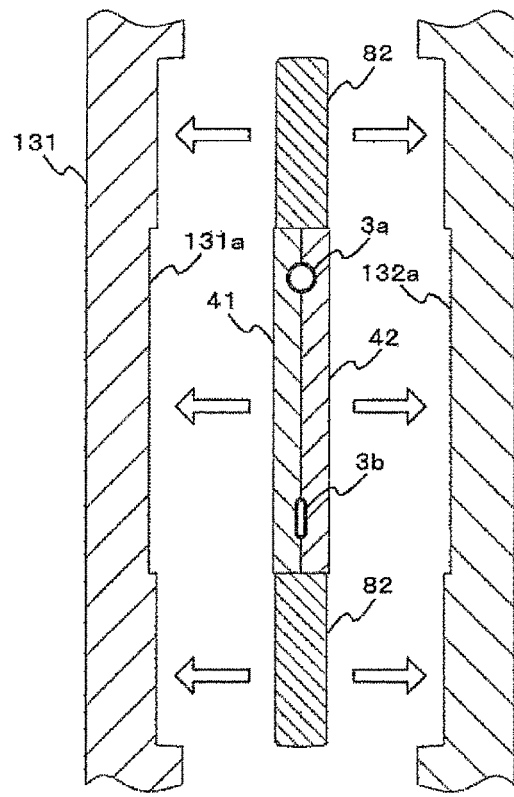 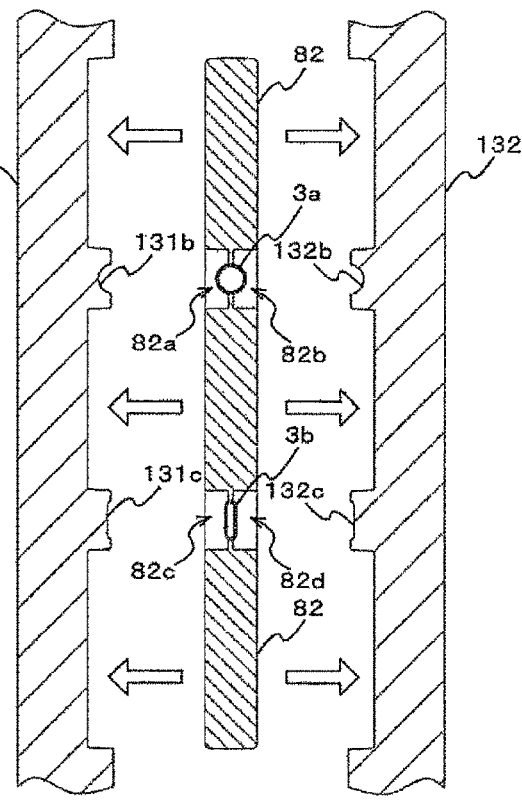

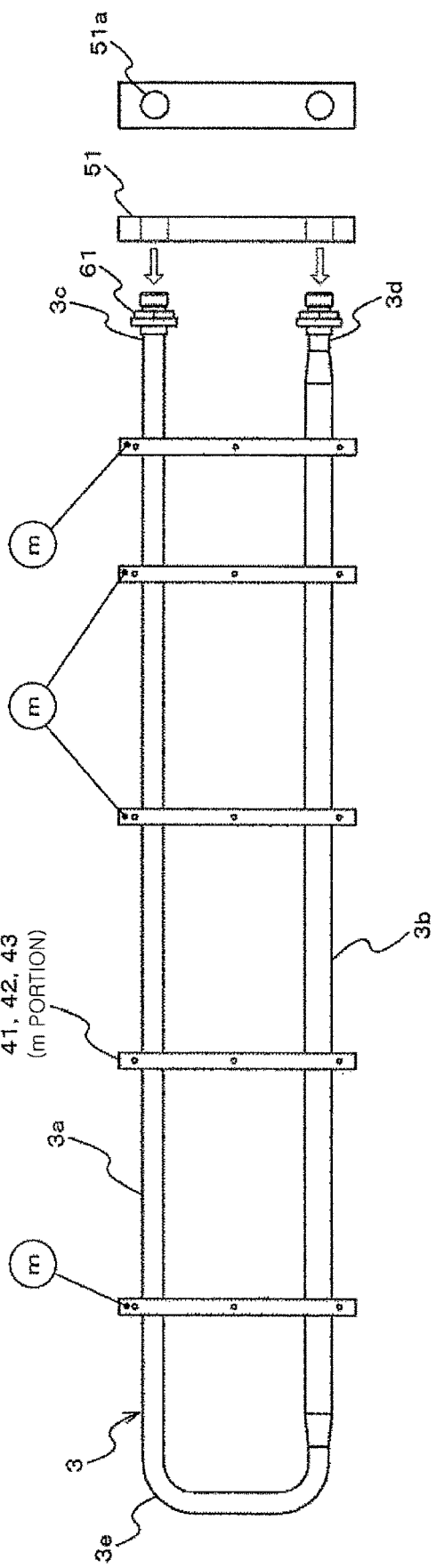

LIQUID-COOLING COLD PLATE AND METHOD FOR MANUFACTURING SAME

FIELD OF THE INVENTION

The present invention relates to a liquid-cooling cold plate for cooling electronic components that generate intense heat, such as semiconductor devices, a CPU, an FET, a power amplifier and the like used in an electronic circuit in an electronic device, by using a liquid coolant, and a method for manufacturing the same.

BACKGROUND OF THE INVENTION

A plurality of circuit boards is tightly installed in a housing of an electronic device such as a communication device, a video device, a broadcasting device or the like. Electronic components that generate intense heat, such as semiconductor devices, a CPU (Central Processing Unit), FET (Field Effect Transistor), a power amplifier and the like, are mounted on each of the circuit boards. Accordingly, a cooling device for cooling the electronic device is required. The electronic components that generate intense heat, such as the semiconductor devices, the CPU, the power amplifier and the like, has a narrow temperature range of effective operation. Therefore, it is required to cool the electronic components individually, not the entire electronic device. As a consequence, in a recent cooling device for an electronic device, a cooling pipe through which a liquid coolant flows is provided close to each of the electronic components.

For example, in a water cooling type cold plate and a manufacturing method thereof of Patent Document 1, there is suggested a technique for improving a cooling efficiency by increasing a heat contact area between the water cooling type cold plate and a flat cooling pipe by attaching in a zigzag manner the flat cooling pipe to the water cooling type cold plate where the heating components are arranged.

Patent Document 1: Japanese Patent No. 3154247

In the water cooling type cold plate of Patent Document 1, a metal pipe having a circular cross sectional shape is extended in a zigzag shape. Next, at least a portion of the metal pipe which is inserted into an aluminum plate is planarized. The flat metal pipe is installed in a casting mold by a spacer and, then, molten aluminum is poured into the casting mold. Accordingly, the metal pipe having a zigzag shape is cast by the molten aluminum.

However, in the water cooling type cold plate of Patent Document 1, a bar member having a flat front surface and a flat rear surface is used as the spacer for positioning the metal pipe in the casting mold. Therefore, depending on a flowing direction of molten aluminum into the casting mold, the metal pipe is deformed by the stream pressure of the molten aluminum and misaligned with a heating component to be cooled. Accordingly, the cooling properties are not stabilized.

SUMMARY OF THE INVENTION

In view of the above, the present invention provides a liquid-cooling cold plate capable of achieving stable cooling properties by arranging a metal plate embedded in a cold plate main body in a desired position, e.g., a position directly below a heating compound while reducing misalignment and deformation of the metal pipe embedded inside the cold plate main body without being affected by the stream pressure or flowing direction of molten metal during casting, and a method for manufacturing the same.

In accordance with an aspect, there is provided a method of manufacturing a liquid-cooling cold plate, in which cast molding is performed after embedding a metal pipe for supplying a cooling liquid in a casting mold, the method including: providing fixing brackets to be attached to the metal pipe to maintain a positioning accuracy between a plurality of portions of the metal pipe embedded in the casting mold; and performing cast molding by pouring molten metal into the casting mold while attaching the fixing brackets to the metal pipe.

In the method of manufacturing a liquid-cooling cold plate, the cast molding may be performed by pouring the molten metal into the casting mold in a state where positioning is realized by fitting the fixing brackets or protrusions formed at the fixing brackets to recesses formed at the casting mold.

In the method of manufacturing a liquid-cooling cold plate, protrusions of the fixing brackets with respect to the cast-molded liquid-cooling cold plate may be planarized by milling.

In the method of manufacturing a liquid-cooling cold plate, the cast molding may be performed by pouring the metal molten into the casting mold in a state where positioning is realized by fitting protrusions formed at the casting mold to recesses formed at the fixing brackets.

In accordance with another aspect, there is provided a method of manufacturing a liquid-cooling cold plate, in which cast molding is performed after embedding a metal pipe for supplying a cooling liquid in a casting mold, the method including: providing a pipe pressing portion for pressing and fixing the metal pipe at the casting mold, and performing casting molding by pouring molten metal into the casting mold while pressing and fixing the metal pipe by the pipe pressing portion.

In the method of manufacturing a liquid-cooling cold plate, a fixing bracket to be attached to the metal pipe may be provided to maintain positional relationship between a plurality of portions of the metal pipe embedded in the casting mold; and cast molding may be performed by pouring molten metal into the casting mold while attaching the fixing brackets to the metal pipe.

In the method of manufacturing a liquid-cooling cold plate, another fixing bracket to be attached to an inlet and an outlet of the metal pipe may be provided to maintain positional relationship between the inlet and the outlet of the metal pipe which protrude from a liquid-cooling cold plate main body; and cast molding may be performed by pouring molten metal into the casting mold in a state where positioning is realized by attaching the another fixing bracket to the inlet and the outlet of the metal pipe and fitting the another fixing bracket to the casting mold.

In the method of manufacturing a liquid-cooling cold plate, at least a part of the metal pipe may be planarized.

In the method of manufacturing a liquid-cooling cold plate, a curved connection portion of the metal pipe positioned opposite to an inlet and an outlet of the metal pipe which protrude from a liquid-cooling cold plate main body may protrude from the liquid-cooling cold plate main body.

In accordance with still another aspect, there is provided a liquid-cooling cold plate including: a metal pipe configured to supply cooling liquid and a cold plate main body having the metal pipe therein, wherein a fixing bracket to be attached to the metal pipe is provided to maintain position relationship between a plurality of portions of the metal pipe embedded in the cold plate main body, and the fixing bracket is integrated with the cold plate main body by performing cast molding while the fixing bracket is attached to the metal pipe.

In the liquid-cooling cold plate, an inlet and an outlet of the metal pipe and a curved connection portion of the metal pipe positioned opposite to the inlet and the outlet of the metal pipe may protrude from the cold plate main body.

In the liquid-cooling cold plate, at least a part of the metal pipe may be planarized.

As described above, in accordance with the present invention, it is possible to arrange a metal plate embedded in a cold plate main body in a desired position, e.g., a position directly below a heating compound, and achieve stable cooling properties because misalignment and deformation of the metal pipe embedded inside the cold plate main body can be reduced without being affected by the stream pressure or flowing direction of molten metal during casting, and a method for manufacturing the same.

BRIEF DESCRIPTION OF THE DRAWINGS

FIGS. 3A and 3B are assembly diagrams showing a state in which the metal pipe fixing brackets are attached to the metal pipe in the liquid-cooling cold plate according to the first embodiment.

FIG. 6 shows a state in which a casting mold is opened after molding is opened in the case of manufacturing the liquid-cooling cold plate according to the second embodiment.

FIG. 7 shows another example of the state in which the casting mold after casting is opened in the case of manufacturing the liquid-cooling cold plate according to the second embodiment.

FIGS. 8A to 8C are respectively a front view and cross sectional views of a liquid-cooling cold plate according to a third embodiment.

FIGS. 9A and 9B show a state in which a casting mold is opened after molding in the case of manufacturing the liquid-cooling cold plate according to the third embodiment.

FIGS. 10A and 10B explain a method for attaching metal pipe fixing brackets and coupler fixing brackets to a metal pipe in a liquid-cooling cold plate according to a fourth embodiment.

DETAILED DESCRIPTION OF THE EMBODIMENTS

First Embodiment

Figure 1:
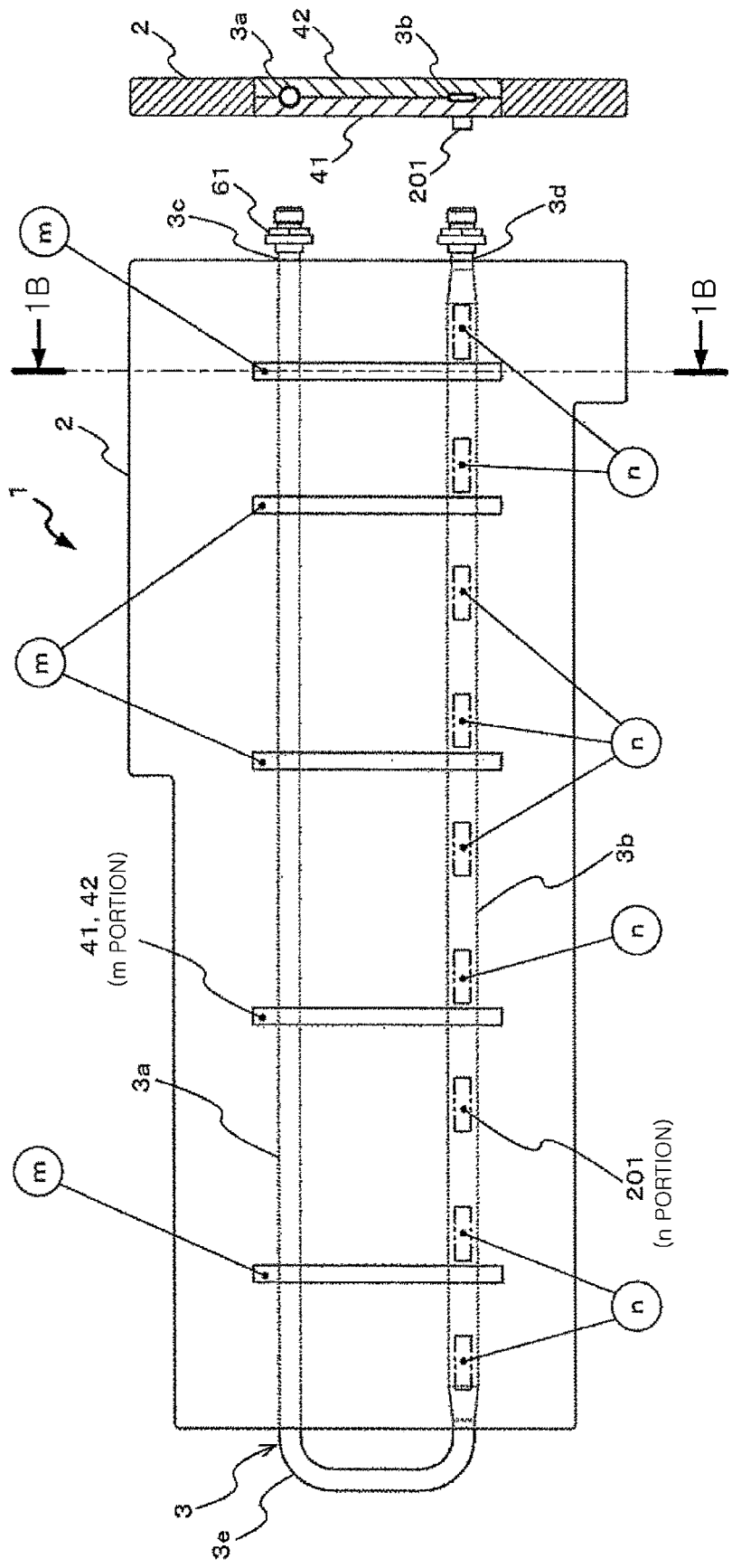
FIGS. 1A and 1B are respectively a front view and a cross sectional view of a liquid-cooling cold plate according to a first embodiment.
Figure 2:
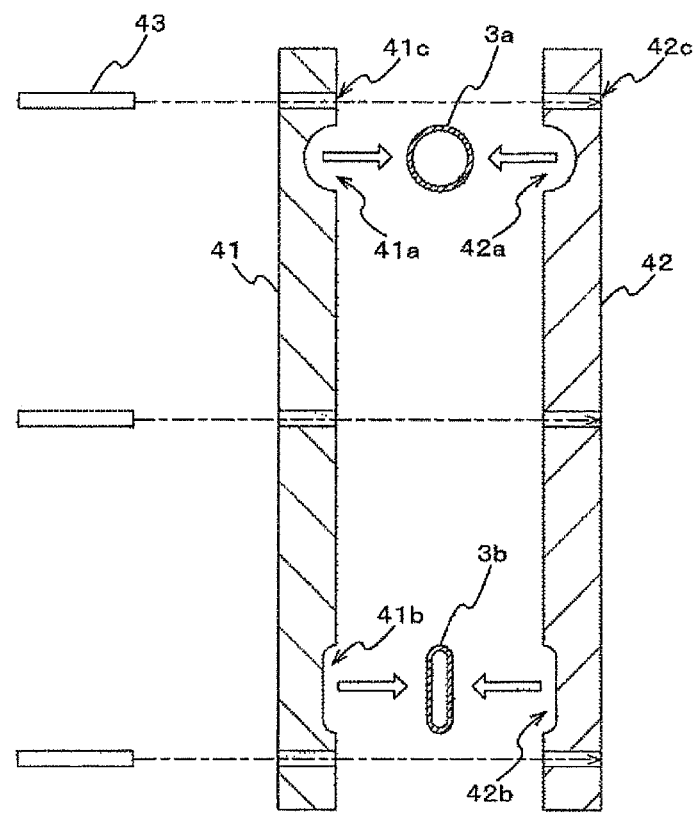
FIG. 2 explains a method for attaching metal pipe fixing brackets to a metal pipe in the liquid-cooling cold plate according to the first embodiment.
Figure 4:
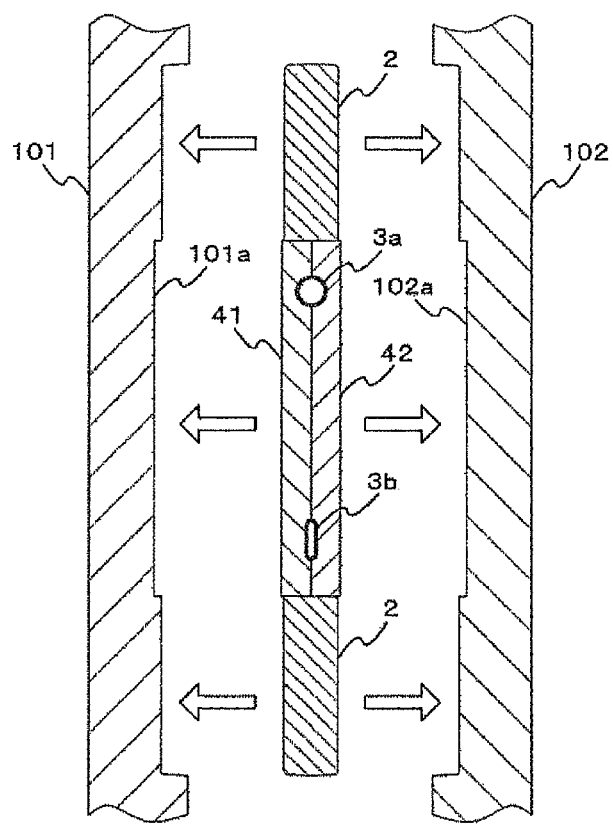
FIG. 4 shows a state in which a casting mold is opened after molding in the case of manufacturing the liquid-cooling cold plate according to the first embodiment.

Hereinafter, a liquid-cooling cold plate according to a first embodiment will be described with reference to FIGS. 1A to 4. FIGS. 1A and 1B are respectively a front view and a cross sectional view of the liquid-cooling cold plate according to the first embodiment. FIG. 1A is a front view and FIG. 1B is a cross sectional view taken along the line 1B-1B in FIG. 1A. FIG. 2 explains a method for attaching metal pipe fixing brackets to a metal pipe in the liquid-cooling cold plate according to the first embodiment. FIGS. 3A and 3B are assembly diagrams showing a state in which the metal pipe fixing brackets are attached to the metal pipe in the liquid-cooling cold plate according to the first embodiment. FIG. 3A is a front view and FIG. 3B is a cross sectional view taken along a surface 3B-3B in FIG. 3A. FIG. 4 shows a state in which a casting mold is opened after molding in the case of manufacturing the liquid-cooling cold plate according to the first embodiment.

The liquid-cooling cold plate 1 according to the first embodiment is not limited to an electronic device such as a communication device, a video device, a broadcasting device or the like and may be applied to any electronic device having a circuit board on which electronic components that generate intense heat are mounted.

(Configuration of Liquid-Cooling Cold Plate 1)

As shown in FIGS. 1A and 1B, the liquid-cooling cold plate 1 according to the first embodiment includes a metal pipe 3, a cold plate main body 2, a metal pipe fixing bracket (1) 41, a metal pipe fixing bracket (2) 42, and a coupler 61. The liquid-cooling cold plate 1 supplies cooling liquid such as water or the like into the metal pipe 3 and takes heat from electronic components (hereinafter, referred to as "high-heat generating components") 201 (n portions in FIG. 1A) that generate intense heat and are provided directly above a flat pipe straight portion 3b of the metal pipe 3 embedded in the cold plate main body 2, thereby cooling the high-heat generating components 201.

Further, the high-heat generating components 201 shown in FIGS. 1A and 1B are not constituent components of the liquid-cooling cold plate 1 but specify a positional relationship with the liquid-cooling cold plate 1. The high-heat generating components 201 may individually be in contact with the liquid-cooling cold plate 1 or may collectively be in contact with the liquid-cooling cold plate 1 while being mounted on a circuit board (not shown). The metal pipe 3 positioned directly below the high-heat generating components 201 is a flat pipe. However, the metal pipe 3 may be a circular pipe or the like other than the flat pipe.

The metal pipe 3 is machined in a U shape by a bender and partially planarized by a presser. The metal pipe 3 includes a circular pipe straight portion 3c, a circular pipe straight portion 3a, a circular pipe curved portion 3e, a flat pipe straight portion 3b and a circular pipe straight portion 3d. The circular pipe straight portion 3a and the flat pipe straight portion 3b of the metal pipe 3 are embedded in the cold plate main body 2. The circular pipe straight portion 3c, the circular pipe straight portion 3d and the circular pipe curved portion 3e are provided outside the cold plate main body 2. Couplers 61 are attached to leading ends of the circular pipe straight portion 3c and 3d.

Further, the metal pipe 3 is made of, e.g., copper, stainless steel copper or the like.

The cold plate main body 2 is cast-molded by inserting the metal pipe 3 in a casting mold to be described later and pouring molten metal such as aluminum, aluminum alloy or the like into the casting mold.

As shown in FIG. 2, the metal pipe fixing bracket (1) 41 and the metal pipe fixing bracket (2) 42 have arc-shaped recesses 41a and 42a and elliptical recesses 41b and 42b, respectively, in conformation with the shape of the metal pipe 3 to be disposed therebetween. In order to maintain a positional relationship between the circular pipe straight portion 3a and the flat pipe straight portion 3b of the metal pipe 3 embedded in the casting mold, the metal pipe fixing bracket (1) 41 and the metal pipe fixing bracket (2) 42 are attached such that the circular pipe straight portion 3a and the flat pipe straight portion 3b are coupled/fixed to each other at predetermined positions (m portions in FIG. 1A which avoid portions directly below the high-heat generating components 201. The metal pipe fixing bracket (1) 41 and the metal pipe fixing bracket (2) 42 are made of, e.g., aluminum. The molten metal is poured into the casting mold in a state where the metal pipe fixing bracket (1) 41 and the metal pipe fixing bracket (2) 42 are attached to the circular pipe straight portion 3a and the flat pipe straight portion 3b of the metal pipe 3.

The couplers 61 are fluid couplers attached to leading end portions of the circular pipe straight portions 3c and 3d of the metal pipe 3. When the liquid-cooling cold plate 1 is installed in the electronic device, the couplers 61 are fitted and connected to couplers 301a of a shelf 301 side.

(Method for Manufacturing the Liquid-Cooling Cold Plate 1)

Next, a method for manufacturing the liquid-cooling cold plate 1 according to the first embodiment will be described with reference to FIGS. 2 to 4.

Before the metal pipe 3 is embedded in a casting mold, first, as shown in FIGS. 2 and 3, the predetermined portions (m portions in FIG. 1A which avoid portions directly below the high-heat generating components 201) of the circular pipe straight portion 3a and the flat pipe straight portion 3b of the metal pipe 3 are sandwiched between the recesses 41a and 42a of the metal pipe fixing bracket (1) 41 and the recesses 41b and 42b of the metal pipe fixing bracket (2) 42, respectively. Then, fixing pins 43 are inserted into through-holes 41c of the metal pipe fixing bracket (1) 41 and through-holes 42 of the metal pipe fixing bracket (2) 42, thereby pressing and fixing the metal pipe fixing bracket (1) 41 and the metal pipe fixing bracket (2) 42. As can be seen from FIG. 4 to be described later, surfaces of the metal pipe fixing bracket (1) 41 and the metal pipe fixing bracket (2) 42 which are opposite to the surfaces where the recesses are formed are designed to protrude compared to the surface of the cold plate main body 2. By sandwiching and pressing the protrusions by the casting mold, the misalignment of the metal pipe 3 is reduced.

As shown in FIG. 4, the casting mold (1) 101 and the casting mold (2) 102 are closed in a state where the metal pipe fixing bracket (1) 41 and the metal pipe fixing bracket (2) 42 attached to the circular pipe straight portion 3a and the flat pipe straight portion 3b of the metal pipe 3 are fitted to a recessed groove 101a of the casting mold (1) 101 and a recessed groove 102a of the casting mold (2) 102. By pouring molten metal in the casting mold (1) 101 and the casting mold (2) 102 which are closed, the liquid-cooling cold plate 1 shown in FIGS. 1A and 1B is cast-molded.

In other words, by sandwiching and firmly pressing the metal pipe fixing bracket (1) 41 and the metal pipe fixing bracket (2) 42 by the recessed groove 101a of the casting mold (1) 101 and the recessed groove 102a of the casting mold (2) 102, the misalignment and the deformation of the metal pipe 3 by the stream pressure of the molten metal during the casting can be reduced. Accordingly, the misalignment and the deformation of the circular pipe straight portion 3a and the flat pipe straight portion 3b of the metal pipe 3 can be reduced.

In the above embodiment, the recessed grooves are formed at the casting mold by using a metal casting mold. However, in the case of using a sand mold as the casting mold, for example, the recessed grooves can be formed at the casting mold while closing the mold by setting a dimension of the metal pipe fixing bracket to be greater than an inner dimension of the casting mold after the mold is closed.

As shown in FIG. 4, after the cast molding, the metal pipe fixing bracket (1) 41 and the metal pipe fixing bracket (2) 42 protrude compared to the surface of the cold plate main body 2. Therefore, the smoothness of the surface of the liquid-cooling cold plate 1 is ensured by milling the entire surface of the liquid-cooling cold plate 1 or only protruded portions of the metal pipe fixing bracket (1) 41 and the metal pipe fixing bracket (2) 42.

In the above embodiment, the positioning between the casting mold and the metal pipe fixing bracket is performed by fitting the protruded portions of the metal pipe fixing brackets to the recessed grooves of the casting mold. On the contrary, it is also possible to perform the positioning between the casting mold and the metal pipe fixing brackets by providing positioning pins on a surface, to be in contact with the metal pipe fixing brackets, of the casting mold and forming recessed holes to be fitted to the positioning pins at positions corresponding to the positions of the positioning pins of the metal pipe fixing brackets.

Further, in the above embodiment, the recessed grooves are formed at the casting mold by using a metal casting mold. However, in the case of using a sand mold as the casting mold, for example, the recessed grooves can be formed at the casting mold while closing the mold by setting a dimension of the positioning pins to be greater than an inner dimension of the casting mold after the mold is closed, considering a deformation error of the casting mold.

As described above, in accordance with the liquid-cooling cold plate 1 according to the first embodiment, the misalignment and the deformation of the metal pipe embedded in the cold plate main body can be reduced without being affected by the stream pressure and the flowing direction of the molten metal during the casting. Therefore, the metal pipe can be provided at a desired position, e.g., a position directly below the heat-generating component or the like, and stable cooling properties can be obtained.

Second Embodiment

Figure 5:
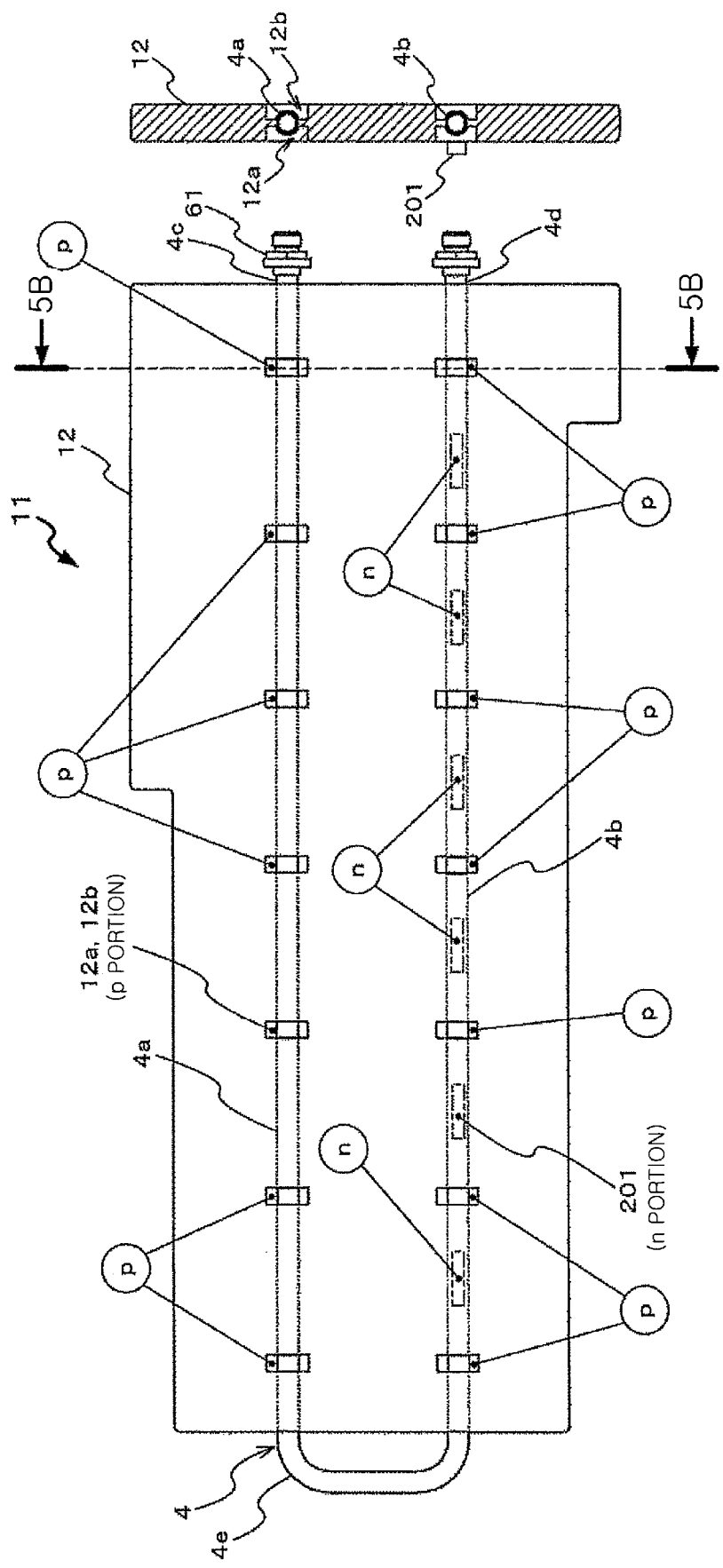
FIGS. 5A and 5B are respectively a front view and a cross sectional view of a liquid-cooling cold plate according to a second embodiment.

Hereinafter, a liquid-cooling cold plate according to a second embodiment will be described with reference to FIGS. 5A to 7. FIGS. 5A and 5B are respectively a front view of a cross sectional view of the liquid-cooling cold plate according to the second embodiment. FIG. 5A is a front view and FIG. 5B is a cross sectional view taken along the line 5B-5B shown in FIG. 5A. FIG. 6 shows a state in which the casting mold is opened after molding in the case of manufacturing the liquid-cooling cold plate according to the second embodiment. FIG. 7 shows another example of the state in which the casting mold is opened after molding in the case of manufacturing the liquid-cooling cold plate according to the second embodiment. In FIGS. 5A to 7, like reference numerals will be used for like parts, and redundant description thereof will be omitted.

The liquid-cooling cold plate 11 according to the second embodiment may be applied to any electronic device having a circuit board on which electronic components that generate intense heat without being limited to an electronic device such as a communication device, a video device, a broadcasting device or the like.

(Configuration of the Liquid-Cooling Cold Plate 11)

As shown in FIGS. 5A and 5B, the liquid-cooling cold plate 11 according to the second embodiment includes a metal pipe 4, a cold plate main body 12 and a coupler 61. The liquid-cooling cold plate 11 supplies cooling liquid such as water or the like into the metal pipe 4 and takes heat from electronic components (hereinafter, referred to as "high-heat generating components") 201 (n portions in FIG. 5A) that generate intense heat and are provided directly above a circular pipe straight portion 4b of the metal pipe 4 embedded in the cold plate main body 12, thereby cooling the high-heat generating components 201.

Further, the high-heat generating components 201 shown in FIGS. 5A and 5B are not constituent components of the liquid-cooling cold plate 11 but specify a positional relationship with the liquid-cooling cold plate 11. The high-heat generating components 201 may individual be in contact with the liquid-cooling cold plate 11 or may collectively be in contact with the liquid-cooling cold plate 11 while being mounted on a circuit board (not shown). The metal pipe 4 positioned directly below the high-heat generating components 201 is a circular pipe. However, the metal pipe 4 may be a flat pipe or the like other than the circular pipe.

The metal pipe 4 is machined in a U shape by a bender. The metal pipe 4 includes circular pipe straight portions 4c and 4a, a circular pipe curved portion 4e, circular pipe straight portions 4b and 4d. The circular pipe straight portion 4a and the circular pipe straight portion 4b of the metal pipe 4 are embedded in the cold plate main body 12. The circular pipe straight portion 4c, the circular pipe straight portion 4d and the circular pipe curved portion 4e are provided outside the cold plate main body 12. Couplers 61 are attached to leading ends of the circular pipe straight portion 4c and 4d.

Further, the metal pipe 4 is made of, e.g., copper, stainless steel copper or the like.

The cold plate main body 12 is cast-molded by pouring molten metal such as aluminum, aluminum alloy or the like into a casting mold to be described later. As shown in FIGS. 5A and 5B, a pair of recesses (1) and (2) 12a and 12b with the metal pipe 4 interposed therebetween is formed at a plurality of predetermined portions (p portions in FIG. 5A which avoid portions directly below the high-heat generating components 201). The recesses (1) 12a and (2) 12b are formed by a protrusion 111a of the casting mold (1) 111 and a protrusion 112a of the casting mold (2) 112 which will be described later.

The couplers 61 are fluid couplers attached to leading end portions of the circular pipe straight portions 4c and 4d of the metal pipe 4. When the liquid-cooling cold plate 1 is installed in the electronic device, the couplers 61 are fitted and connected to couplers 301a of the shelf 301 side which will be described later.

(Method for Manufacturing the Liquid-Cooling Cold Plate 11)

Hereinafter, a method for manufacturing the liquid-cooling cold plate 11 according to the second embodiment will be described with reference to FIG. 6.

As shown in FIG. 6, the casting mold (1) 111 and the casting mold (2) 112 have the protrusions 111a and 112a formed in conformation with the shape of the metal pipe 4, respectively, at predetermined positions thereof (p positions indicated in FIG. 5A which correspond to the positions of the recesses (1) and (2) 12a and 12b of the cold plate main body 12). When the casting mold (1) 111 and the casting mold (2) 112 are closed, the circular pipe straight portions 4a and 4b of the metal pipe 4 are sandwiched at the same time by the protrusion 111a of the casting mold (1) 111 and the protrusion 112a of the casting mold (2) 112, thereby positioning the circular pipe straight portions 4a and 4b of the metal pipe 4. By pouring molten metal into the casting mold (1) 111 and the casting mold (2) 112 which are closed, the liquid-cooling cold plate 11 shown in FIGS. 5A and 5B is cast-molded.

In other words, by sandwiching and firmly pressing the circular pipe straight portions 4a and 4b of the metal pipe 4 from opposite sides by the protrusion 111a of the casting mold (1) 111 and the protrusion 112a of the casting mold (2) 112, the misalignment and the deformation of the metal pipe 4 by the stream pressure of the molten metal during the casting can be reduced. Accordingly, it is possible to reduce the misalignment and the deformation of the circular pipe straight portions 4a and 4b of the metal pipe 4.

Next, a method for manufacturing the metal pipe 3 having the flat pipe straight portion 3b which constitutes the liquid-cooling cold plate 1 according to the first embodiment will be described.

As shown in FIG. 7, the casting mold (1) 121 and the casting mold (2) 122 have protrusions 121a and 122a formed in conformation with the shape of the circular pipe straight portion 3a of the metal pipe 3 and protrusions 121b and 122b formed in conformation with the shape of the flat pipe straight portion 3b of the metal pipe 3, respectively, at predetermined positions thereof (p positions indicated in FIG. 5A which correspond to the positions of the recesses (1) and (2) 12a and 12b of the cold plate main body 12). When the casting mold (1) 121 and the casting mold (2) 122 are closed, the circular pipe straight portion 3a of the metal pipe 3 is sandwiched between the protrusion 121a of the casting mold (1) 121 and the protrusion 122a of the casting mold (2) 122, and the flat pipe straight portion 3b of the metal pipe 3 is sandwiched between the protrusion 121b of the casting mold (1) 121 and the protrusion 122b of the casting mold (2) 122, thereby positioning the circular pipe straight portion 3a and the flat pipe straight portion 3b of the metal pipe 3. By pouring the molten metal into the casting mold (1) 121 and the casting mold (2) 122 which are closed, the liquid-cooling cold plate 11 shown in FIGS. 5A and 5B is cast-molded.

In other word, by sandwiching and firmly pressing the circular pipe straight portion 3a and the flat pipe straight portion 3b of the metal pipe 3 from opposite sides by the protrusions 121a and 121b of the casting mold (1) 121 and the protrusions 122a and 122b of the casting mold (2) 122, the deformation of the metal pipe 3 by the stream pressure of the molten metal during the casting can be reduced. Accordingly, it is possible to reduce the misalignment of the circular pipe straight portion 3a and the flat pipe straight portion 3b of the metal pipe 3.

As described above, in accordance with the liquid-cooling cold plate 11 according to the second embodiment, the misalignment and the deformation of the metal pipe embedded into the cold plate main body can be reduced without being affected by the stream pressure and the flowing direction of the molten metal during the casting. Therefore, the metal pipe embedded in the cold plate main body can be provided at a desired position, e.g., a position directly below the heating component or the like. Accordingly, stable cooling properties can be obtained.

Third Embodiment

Hereinafter, a liquid-cooling cold plate according to a third embodiment will be described with reference to FIGS. 8A to 9B. FIGS. 8A to 8C are respectively a front view and cross sectional views of the liquid-cooling cold plate according to the third embodiment. FIG. 8A is a front view and FIGS. 8B and 8C are a cross sectional view taken along a surface 8B-8B shown in FIG. 8A and a cross sectional view taken along an 8C-8C surface shown in FIG. 8A, respectively. FIGS. 9A and 9B show a state in which the casting mold is opened after the casting in the case of manufacturing the liquid-cooling cold plate according to the third embodiment. In FIGS. 8A to 9B, like reference numerals will be used for like parts, and redundant description thereof will be omitted.

A liquid-cooling cold plate 81 according to the third embodiment is characterized in that the techniques of the liquid-cooling cold plates according to the first and the second embodiment are combined.

In the first embodiment, the metal pipe fixing brackets are used to reduce the misalignment and the deformation of the metal pipe embedded in the cold plate main body. In order to further reduce the misalignment and the deformation of the metal pipe, it is required to increase the number of the metal pipe fixing brackets and decrease the interval (pitch) of attachment of the metal pipe fixing brackets to the metal pipe. However, when the number of the metal pipe fixing brackets is increased, the flow of molten metal during the casting is disturbed or the cost is increased.

In the second embodiment, the metal pipe is pressed from opposite sides by the protrusions formed at the casting mold in order to reduce the misalignment and the deformation of the metal pipe embedded in the cold plate main body. In order to further reduce the misalignment and the deformation of the metal pipe, it is required to increase portions for pressing the metal pipe by increasing the number of the protrusions formed at the casting mold. In other words, it is required to decrease the interval (pitch) of the protrusions formed at the casting mold. However, when the number of the portions for pressing the metal pipe is increased, the number of recesses formed at the cold plate main body is also increased. Accordingly, the cooling properties of the cold plate deteriorate.

Therefore, in the third embodiment, the techniques of the first and the second embodiment are employed to decrease the number of the metal pipe fixing brackets and press portions of the metal pipe between the adjacent metal pipe fixing brackets by the protrusions formed at the casting mold. Accordingly, the misalignment and the deformation of the metal pipe can be further reduced without being affected by the stream pressure and the flowing direction of the molten metal during the casting. Further, the cooling properties can be further improved in a cost effective manner.

The liquid-cooling cold plate 81 according to the third embodiment is not limited to an electronic device such as a communication device, a video device, a broadcasting device or the like and may be applied to any electronic device having a circuit board on which electronic components that generate intense heat are mounted.

(Configuration of the Liquid-Cooling Cold Plate 81)

As shown in FIGS. 8A to 8C, the liquid-cooling cold plate 81 according to the third embodiment includes a metal pipe 3, a cold plate main body 82, a metal pipe fixing bracket (1) 41, a metal pipe fixing bracket (2) 42, and couplers 61. The liquid-cooling cold plate 81 supplies cooling liquid such as water or the like into the metal pipe 3 and takes heat from electronic components (hereinafter, referred to as "high-heat generating components") 201 (n portions in FIG. 8A) that generate intense heat and are provided directly above a flat pipe straight portion 3b of the metal pipe 3 embedded in the cold plate main body 82, thereby cooling the high-heat generating components 201.

Further, the high-heat generating components 201 shown in FIGS. 8A to 8C are not constituent components of the liquid-cooling cold plate 81 but specify a positional relationship with the liquid-cooling cold plate 81. The high-heat generating components 201 may individually be in contact with the liquid-cooling cold plate 81 or may collectively be in contact with the liquid-cooling cold plate 81 while being mounted on a circuit board (not shown). The metal pipe 3 positioned directly below the high-heat generating components 201 is a flat pipe. However, the metal pipe 4 may be a circular pipe or the like other than the flat pipe.

The cold plate main body 82 is cast-molded by pouring molten metal such as aluminum, aluminum alloy or the like into a casting mold to be described later. As shown in FIG. 8C, the cold plate main body 82 has a pair of recesses (1) and (2) 82a and 82b with the metal pipe 3 interposed therebetween and a pair of recesses (3) and (4) 82c and 82d with the metal pipe 3 interposed therebetween at predetermined positions thereof (r portions and s portions in FIG. 8A which avoid portions directly below the high-heat generating components 201). The recess (1) 82a, the recess (2) 82b, the recess (3) 82c and the recess (4) 82d are formed by the protrusion 131b of the casting mold (1) 131, the protrusion 132b of the casting mold (2) 132, the protrusion 131c of the casting mold (1) 131, and the protrusion 132c of the casting mold (2) 132, respectively, which will be described later.

As in the case shown in FIGS. 3A and 3B, the metal pipe fixing bracket (1) 41 and the metal pipe fixing bracket (2) 42 are attached such that the circular pipe straight portion 3a and the flat pipe straight portion 3b are coupled and fixed at the predetermined positions (m portions in FIG. 8A which avoid portions directly below the high-heat generating components 201). The metal pipe fixing bracket (1) 41 and the metal pipe fixing bracket (2) 42 are made of, e.g., aluminum. The molten metal is poured into the casting mold in a state where the metal pipe fixing bracket (1) 41 and the metal pipe fixing bracket (2) 42 are attached to the circular pipe straight portion 3a and the flat pipe straight portion 3b of the metal pipe 3.

(Method for Manufacturing the Liquid-Cooling Cold Plate 81)

Next, a method for manufacturing the liquid-cooling cold plate 81 according to the third embodiment will be described with reference to FIGS. 9A and 9B.

Before the metal pipe 3 is embedded in a casting mold, first, as shown in FIGS. 2 and 3, the predetermined portions (m portions in FIG. 8A which avoid portions directly below the high-heat generating components 201) of the circular pipe straight portion 3a and the flat pipe straight portion 3b of the metal pipe 3 are sandwiched between the recesses 41a and 42a of the metal pipe fixing bracket (1) 41 and the recesses 41b and 42b of the metal pipe fixing bracket (2) 42, respectively. Then, fixing pins 43 are inserted into through-holes 41c of the metal pipe fixing bracket (1) 41 and through-holes 42 of the metal pipe fixing bracket (2) 42, thereby pressing and fixing the metal pipe fixing bracket (1) 41 and the metal pipe fixing bracket (2) 42. As can be seen from FIG. 4 described above, surfaces of the metal pipe fixing bracket (1) 41 and the metal pipe fixing bracket (2) 42 which are opposite to the surfaces where the recesses are formed are designed to protrude compared to the surface of the cold plate main body 2. By pressing the protrusions with the casting mold, the misalignment of the metal pipe 3 is reduced.

As shown in FIG. 9A, the casting mold (1) 131 and the casting mold (2) 132 are closed in a state where the metal pipe fixing bracket (1) 41 and the metal pipe fixing bracket (2) 42 attached to the circular pipe straight portion 3a and the flat pipe straight portion 3b of the metal pipe 3 are fitted to the recessed groove 131a of the casting mold (1) 131 and the recessed groove 132a of the casting mold (2) 132.

In the above embodiment, the recessed grooves are formed at the casting mold by using the metal casting mold. However, in the case of using a sand mold as the casting mold, for example, the recessed grooves can be formed at the casting mold while closing the mold by setting a dimension of the metal pipe fixing bracket to be greater than an inner dimension of the casting mold after closing the mold.

Similarly, as shown in FIG. 9B, the casting mold (1) 131 and the casting mold (2) 132 have the protrusions 131b and 132b formed in conformation with the shape of the circular pipe straight portion 3a of the metal pipe 3 and the protrusions 131c and 132c formed in conformation with the shape of the flat pipe straight portion 3b of the metal pipe 3, respectively, at predetermined positions thereof (r portions and s portions in FIG. 8A which correspond to the positions of the recess (1) 82a, the recess (2) 82b, the recess (3) 82c and the recess (4) 82d of the cold plate main body 82). When the casting mold (1) 131 and the casting mold (2) 132 are closed, the circular pipe straight portion 4a of the metal pipe 3 and the flat pipe straight portion 3b of the metal pipe 3 are sandwiched at the same time by the protrusion 131b of the casting mold (1) 131 and the protrusion 132b of the casting mold (2) 132 and by the protrusions 131c of the casting mold (1) 131 and the protrusion 132c of the casting mold (2) 132, respectively. Accordingly, the positioning between the circular pipe straight portion 3a and the flat pipe straight portion 3b of the metal pipe 3 is performed.

By pouring molten metal into the casting mold (1) 131 and the casting mold (2) 132 which are closed, the liquid-cooling cold plate 81 shown in FIGS. 8A to 8C is cast-molded.

In other words, by sandwiching and firmly pressing the metal pipe fixing bracket (1) 41 and the metal pipe fixing bracket (2) 42 by the recessed groove 131a of the casting mold (1) 131 and the recessed groove 131a of the casting mold (2) 132 and by sandwiching and firmly pressing the circular pipe straight portion 3a and the flat pipe straight portion 3b of the metal pipe 3 by the protrusions 131b and 131c of the casting mold (1) 131 and the protrusions 132b and 132c of the casting mold (2) 132, the misalignment and the deformation of the metal pipe 3 by the stream pressure of the molten metal during the casting can be reduced. Accordingly, it is possible to reduce the misalignment and the deformation of the circular pipe straight portion 3a and the flat pipe straight portion 3b of the metal pipe 3.

As shown in FIG. 9A, after molding of the casting mold, the metal pipe fixing bracket (1) 41 and the metal pipe fixing bracket (2) 42 protrude compared to the surface of the cold plate main body 82. Therefore, the smoothness of the surface of the liquid-cooling cold plate 81 is ensured by milling the entire surface of the liquid-cooling cold plate 81 or only protruded portions of the metal pipe fixing bracket (1) 41 and the metal pipe fixing bracket (2) 42.

In the above embodiment, the positioning between the casting mold and the metal pipe fixing bracket is performed by fitting the protruded portions of the metal pipe fixing brackets into the recessed grooves of the casting mold. On the contrary, it is also possible to perform the positioning between the casting mold and the metal pipe fixing brackets by providing positioning pins on a surface, to be in contact with the metal pipe fixing brackets, of the casting mold and forming recessed holes, to be fitted to the positioning pins, at positions of the metal pipe fixing brackets corresponding to the positions of the positioning pins.

Further, in the above embodiment, the recessed grooves are formed at the casting mold by using a metal casting mold. However, in the case of using a sand mold as the casting mold, for example, the recessed grooves can be formed at the casting mold while closing the mold by setting a dimension of the positioning pins to be greater than an inner dimension of the casting mold after closing the mold, considering a deformation error of the casting mold.

As described above, in accordance with the liquid-cooling cold plate 81 according to the third embodiment, the misalignment and the deformation of the metal pipe embedded in the cold plate main body can be reduced without being affected by the stream pressure and the flowing direction of the molten metal during the molding. Therefore, the metal pipe embedded in the cold plate main body can be provided at a desired position, e.g., a position directly below the heating component or the like, and stable cooling properties can be obtained.

The cooling properties can be further improved in a cost effective manner by decreasing the number of the metal pipe fixing brackets and pressing portions of the metal pipe between the adjacent metal pipe fixing brackets by the protrusions formed at the casting mold.

Fourth Embodiment

Figure 11:
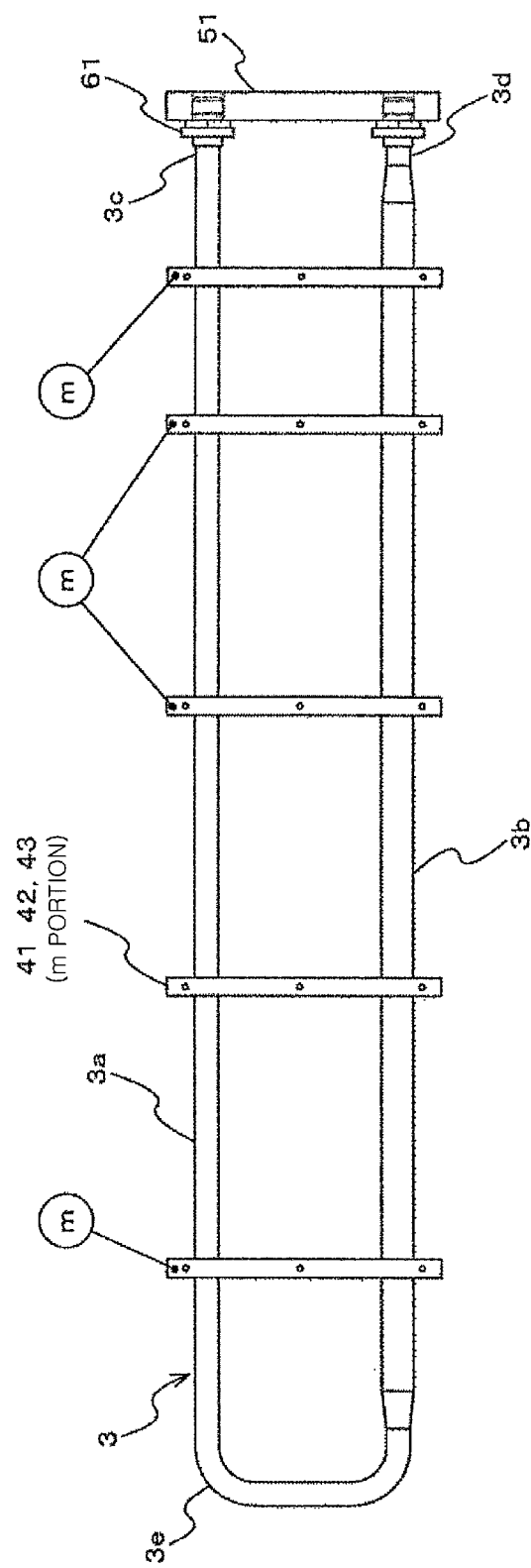
FIG. 11 is an assembly diagram showing a state in which the metal pipe fixing brackets and the coupler fixing brackets are attached to the metal pipe in the liquid-cooling cold plate according to the fourth embodiment.
Figure 12:
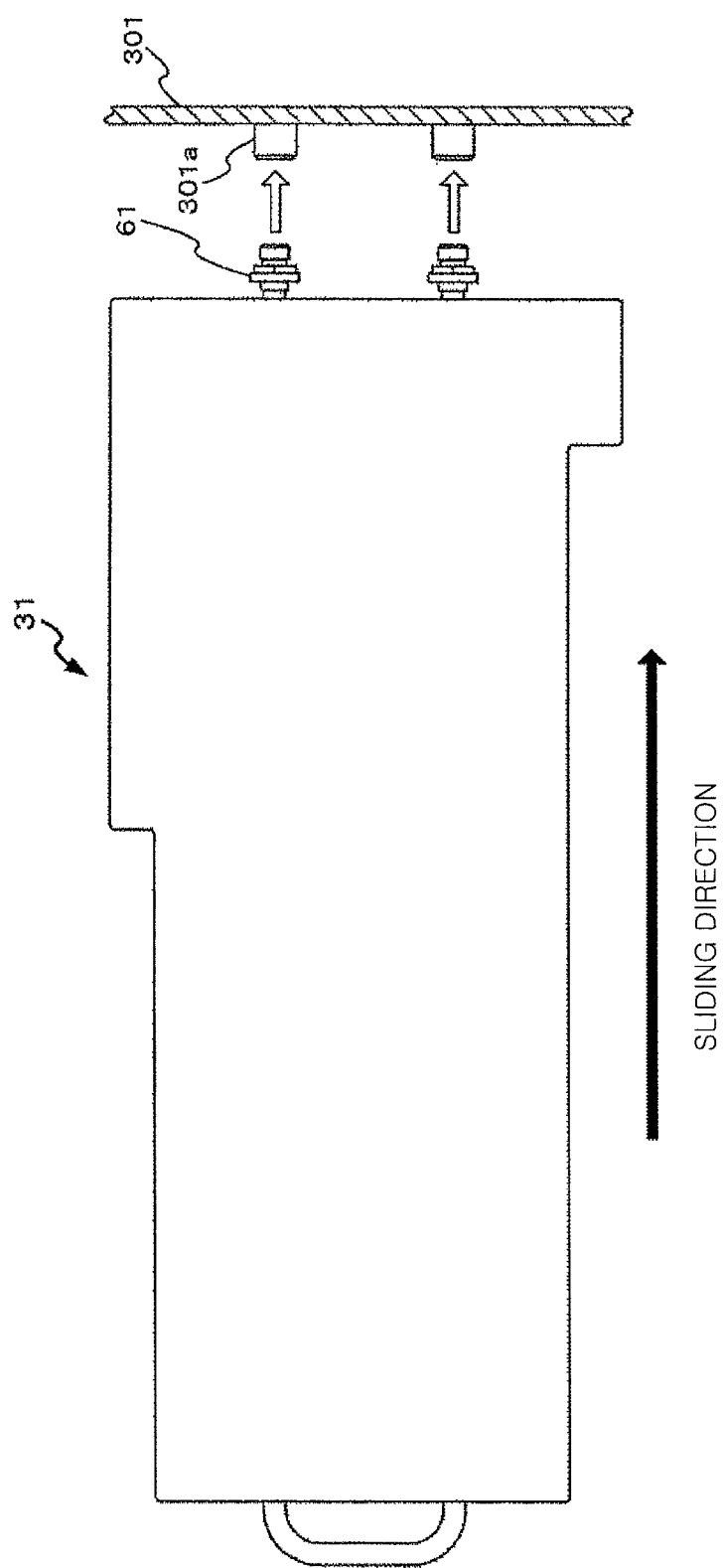
FIG. 12 explains an operation of fitting couplers of the liquid-cooling cold plate to couplers of a shelf, in the liquid-cooling cold plate according to the fourth embodiment.

Hereinafter, a liquid-cooling cold plate according to a fourth embodiment will be described with reference to FIGS. 10A to 12. FIGS. 10A and 10B explain a method for attaching a metal pipe fixing bracket and a coupler fixing bracket to a metal pipe in the liquid-cooling cold plate according to the fourth embodiment. FIG. 10A is a front view and FIG. 10B shows the coupler fixing bracket in detail. FIG. 11 is an assembled diagram showing a state in which the metal pipe fixing bracket and the coupler fixing bracket are attached to the metal pipe in the liquid-cooling cold plate according to the fourth embodiment. FIG. 12 explains an operation of fitting couplers of the liquid-cooling cold plate to couplers of the shelf side in the liquid-cooling cold plate according to the fourth embodiment. Like reference numerals in FIGS. 10 to 12 designate like parts in FIGS. 1A to 9B, and redundant description thereof will be omitted.

The liquid-cooling cold plate 31 according to the fourth embodiment is not limited to an electronic device such as a communication device, a video device, a broadcasting device or the like and may be applied to any electronic device having a circuit board on which electronic components that generate intense heat are mounted.

(Configuration of the Liquid-Cooling Cold Plate 31)

The configuration of the liquid-cooling cold plate 31 according to the fourth embodiment is the same as that of the liquid-cooling cold plate 1 according to the first embodiment except for a method of positioning the metal pipe 3 in manufacturing the liquid-cooling cold plate 31. In other words, in the liquid-cooling cold plate 31 according to the fourth embodiment, the positioning accuracy of the two couplers 61 of the liquid-cooling cold plate 31 is further improved because when the liquid-cooling cold plate 31 is mounted in the electronic device, the two couplers 61 serving as an inlet and an outlet of cooling liquid supplied to the liquid-cooling cold plate 31 need to be slide-fitted to the two couplers 301a of the shelf 301 side at the same time, as can be seen from FIG. 12.

(Method for Manufacturing the Liquid-Cooling Cold Plate 31)

Next, a method for manufacturing the liquid-cooling cold plate 31 according to the fourth embodiment will be described with reference to FIGS. 10A, 10B and 11.

As in the case of the liquid-cooling cold plate 1 according to the first embodiment, before the metal pipe 3 is embedded in a casting mold, first, as shown in FIGS. 2 and 3, the predetermined portions (m portions in FIG. 1A which avoid portions directly below the high-heat generating components 201) of the circular pipe straight portion 3a and the flat pipe straight portion 3b of the metal pipe 3 are sandwiched between the recesses 41a and 42a of the metal pipe fixing bracket (1) 41 and the recesses 41b and 42b of the metal pipe fixing bracket (2) 42, respectively. Then, the fixing pins 43 are inserted into the through-holes 41c of the metal pipe fixing bracket (1) 41 and the through-holes 42 of the metal pipe fixing bracket (2) 42, thereby pressing and fixing the metal pipe fixing bracket (1) 41 and the metal pipe fixing bracket (2) 42. As can be seen from FIG. 4, the surfaces of the metal pipe fixing bracket (1) 41 and the metal pipe fixing bracket (2) 42 which are opposite to the surfaces where the recesses are formed are designed to protrude compared to the surface of the cold plate main body 2. By pressing the protrusions with the casting mold, the misalignment of the metal pipe 3 is reduced.

As shown in FIGS. 10A and 10B, by fitting two circular holes 51a formed at the coupler fixing bracket 51 to the leading ends of the two couplers 61 attached to the metal pipe 3, the couplers 61 are fixed by the coupler fixing bracket 51 and positioned at a predetermined interval.

The coupler fixing unit 51 is made of, e.g., stainless steel or the like.

As shown in FIG. 4, the casting mold (1) 101 and the casting mold (2) 102 are closed in a state where the metal pipe fixing bracket (1) 41 and the metal pipe fixing bracket (2) 42 attached to the circular pipe straight portion 3a and the flat pipe straight portion 3b of the metal pipe 3 are fitted to the recessed groove 101a of the casting mold (1) 101 and the recessed groove 102a of the casting mold (2) 102 and also in a state where the coupler fixing bracket 51 is fitted to a predetermined position in the casting mold (1) 101 and the casting mold (2) 102. By pouring molten metal into the casting mold (1) 101 and the casting mold (2) 102 which are closed, the liquid-cooling cold plate 31 having the same shape as that shown in FIGS. 1A and 1B is cast-molded.

In other words, by sandwiching and firmly pressing the metal pipe fixing bracket (1) 41 and the metal pipe fixing bracket (2) 42 from opposite sides by the recessed groove 101a of the casting mold (1) 101 and the recessed groove 102a of the casting mold (2) 102, the deformation of the metal pipe 3 by the stream pressure of the molten metal during the casting can be reduced. Accordingly, it is possible to reduce the misalignment of the circular pipe straight portion 3a and the flat pipe straight portion 3b of the metal pipe 3.

Since the cast molding is performed in a state where the coupler fixing bracket 51 is fitted to the predetermined position in the casting mold (1) 101 and the casting mold (2) 102, the misalignment of the two couplers 61 can be reduced.

Therefore, when the liquid-cooling cold plate 31 is slide-connected to the shelf 301, the coupler 61 of the liquid-cooling cold plate 31 and the coupler 301a of the shelf 301 side can be easily connected.

The coupler fixing bracket 51 may be separated from the coupler 61 after the molding to be used again.

As shown in FIG. 4, after the cast molding, the metal pipe fixing bracket (1) 41 and the metal pipe fixing bracket 2 (42) are protruded compared to the surface of the cold plate main body 2. Therefore, the smoothness of the surface of the liquid-cooling cold plate 1 is ensured by milling the entire surface of the liquid-cooling cold plate 1 or only protruded portions of the metal pipe fixing bracket (1) 41 and the metal pipe fixing bracket (2) 42.

As described above, in accordance with the liquid-cooling cold plate 31 according to the fourth embodiment, the misalignment and the deformation of the metal pipe embedded in to cold plate main body can be reduced without being affected by the stream pressure and the flowing direction of the molten metal during the casting. Therefore, the metal pipe can be provided at a desired position, e.g., a position directly below the heating component or the like, and stable cooling properties can be obtained.

Further, the working efficiency in connecting the couplers of the liquid-cooling cold plate and the couplers of the shelf side can be improved.

The present invention is not limited to the above embodiments and may be variously modified without departing from the scope of the invention. Further, various modifications may be made by appropriately combining a plurality of constituent elements that are not disclosed in the above embodiments.

INDUSTRIAL APPLICABILITY

The present invention is not limited to an electronic device such as a communication device, a video device and a broadcasting device and may be used in an industry of manufacturing an electronic device having a circuit board on which electronic components that generate intense heat are mounted.

| Description of Reference Numerals | |
|---|---|
| 1: liquid-cooling cold plate | |
| 2: cold plate main body | 3: metal pipe |
| 3a: circular pipe straight portion | |
| 3b: flat pipe straight portion | |
| 3c: circular pipe straight portion | |
| 3d: circular pipe straight portion | |
| 3e: circular pipe curved portion | |
| 4: metal pipe | |
| 4a: circular pipe straight portion | |
| 4b: circular pipe straight portion | |
| 4c: circular pipe straight portion | |
| 4d: circular pipe straight portion | |
| 4e: circular pipe curved portion | |
| 11: liquid-cooling cold plate | |
| 12: cold plate main body | 12a: recess (1) |
| 12b: recess (2) | 22: cold plate main body |
| 22a: recess (1) | 22b: recess (2) |
| 22c: recess (3) | 22d: recess (4) |
| 31: liquid-cooling cold plate | |
| 41: metal pipe fixing bracket (1) | |

-continued

Description of Reference Numerals

| | |
|---|---|
| 41a: arc-shaped recess | 41b: elliptical recess |
| 41c: through-hole | |
| 42: metal pipe fixing bracket (2) | |
| 42a: arc-shaped recess | 42b: elliptical recess |
| 42c: through-hole | 43: fixing pin |
| 51: coupler fixing bracket | |
| 51a: circular hole | 61: coupler |
| 81: liquid-cooling cold plate | |
| 82: cold plate main body | |
| 82a: recess (1) | 82b: recess (2) |
| 82c: recess (3) | 82d: recess (4) |
| 101: casting mold (1) | 101a: recessed groove |
| 102: casting mold (2) | 102a: recessed groove |
| 111: casting mold (1) | 111a: protrusion |
| 112: casting mold (2) | 112a: protrusion |
| 121: casting mold (1) | 121a: protrusion |
| 121b: protrusion | 122: casting mold (2) |
| 122a: protrusion | 122b: protrusion |
| 131: casting mold (1) | 131a: recessed groove |
| 131b: protrusion | 131c: protrusion |
| 132: casting mold (2) | 132a: recessed groove |
| 132b: protrusion | 132c: protrusion |
| 201: high-heat generating component | |
| 301: shelf | 301a: coupler |

What is claimed is:

1. A method of manufacturing a liquid-cooling cold plate, in which cast molding is performed after embedding a curved metal pipe for supplying a cooling liquid in a casting mold, and a heat-generating component is disposed on the cast molded metal pipe, the method comprising:

providing a plurality of pipe pressing portions in conformation with the shape of the curved metal pipe in positions which avoid portions directly below the heat-generating component for pressing and fixing the metal pipe at the casting mold, and performing casting molding by pouring molten metal into the casting mold while sandwiching, pressing and fixing the metal pipe by the pipe pressing portions.

2. A liquid-cooling cold plate, in which cast molding is performed after embedding a curved metal pipe, and a heat-generating component is mounted directly above the cast molded metal pipe, comprising:

a pair of recesses configured to be provided in a plurality of positions which avoid portions directly below the heat-generating component, wherein the metal pipe is pressed, fixed and sandwiched by the pair of recesses when the metal pipe is embedded in the liquid-cooling cold plate.

* * * * *